(12) United States Patent
Moon et al.

(10) Patent No.: US 12,538,839 B2
(45) Date of Patent: Jan. 27, 2026

(54) DISPLAY APPARATUS

(71) Applicant: Samsung Display Co., Ltd., Yongin-si (KR)

(72) Inventors: Jaesik Moon, Yongin-si (KR); Yongdoo Park, Yongin-si (KR); Kyemoon Lee, Yongin-si (KR); Changho Hyun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 569 days.

(21) Appl. No.: 17/741,870

(22) Filed: May 11, 2022

(65) Prior Publication Data

US 2023/0034834 A1 Feb. 2, 2023

(30) Foreign Application Priority Data

Aug. 2, 2021 (KR) .......................... 10-2021-0101533

(51) Int. Cl.
| | | |
|---|---|---|
| *H10K 59/131* | (2023.01) | |
| *H01L 23/00* | (2006.01) | |
| *H01L 25/18* | (2023.01) | |
| *H10K 59/129* | (2023.01) | |

(52) U.S. Cl.
CPC .............. *H01L 25/18* (2013.01); *H01L 24/06* (2013.01); *H10K 59/131* (2023.02); *H01L 24/05* (2013.01); *H01L 24/08* (2013.01); *H01L 2224/05573* (2013.01); *H01L 2224/06155* (2013.01); *H01L 2224/08147* (2013.01); *H01L 2224/08225* (2013.01)

(58) Field of Classification Search
CPC .............. H10K 59/131; H10K 59/129; H10K 59/1275; H01L 33/62
See application file for complete search history.

(56) References Cited

U.S. PATENT DOCUMENTS

| | | |
|---|---|---|
| 6,703,702 B2 | 3/2004 | Inoue et al. |
| 8,730,427 B2 | 5/2014 | Lee |
| 10,209,542 B1 * | 2/2019 | Shen ................. G02F 1/133514 |
| 10,546,796 B2 | 1/2020 | Hu et al. |
| 2011/0164210 A1 * | 7/2011 | Tsuda ..................... H10K 50/86 |
| | | 359/488.01 |

(Continued)

FOREIGN PATENT DOCUMENTS

| | | |
|---|---|---|
| CN | 107919067 A | 4/2018 |
| CN | 209676596 U | 11/2019 |

(Continued)

OTHER PUBLICATIONS

Communication dated Dec. 13, 2025, issued by the China National Intellectual Property Administration in Chinese Application No. 202210900077.9.

*Primary Examiner* — Michele Fan
(74) *Attorney, Agent, or Firm* — Sughrue Mion, PLLC

(57) ABSTRACT

A display apparatus includes a first substrate including a display area and a non-display area at least partially surrounding the display area, and a groove that overlaps the non-display area and is recessed in a thickness direction, pixels located on the first substrate and overlapping the display area, a driving chip located in the groove, and a printed circuit board located in the non-display area and overlapping the driving chip in a plan view.

20 Claims, 12 Drawing Sheets

(56) References Cited

U.S. PATENT DOCUMENTS

| | | | |
|---|---|---|---|
| 2012/0049206 A1* | 3/2012 | Choi | H10K 50/858 |
| | | | 257/E33.062 |
| 2018/0102083 A1 | 4/2018 | So et al. | |
| 2019/0115274 A1* | 4/2019 | Hu | H01L 25/167 |
| 2019/0393440 A1* | 12/2019 | Xin | H10K 71/00 |
| 2021/0011325 A1 | 1/2021 | Yeh et al. | |
| 2021/0249627 A1* | 8/2021 | Lee | H10K 71/421 |
| 2021/0257350 A1 | 8/2021 | Hu | |

FOREIGN PATENT DOCUMENTS

| | | | | |
|---|---|---|---|---|
| CN | 111712758 A | | 9/2020 | |
| CN | 112201155 A | | 1/2021 | |
| JP | 3401144 | | 4/2003 | |
| JP | 3613151 B2 | * | 1/2005 | |
| KR | 10-0893810 | | 4/2009 | |
| KR | 2017133573 A | * | 12/2017 | ........... G02F 1/1345 |
| KR | 10-1835109 | | 3/2018 | |
| KR | 10-2020-0106929 | | 9/2020 | |
| KR | 10-2159873 | | 10/2020 | |

\* cited by examiner

DISPLAY APPARATUS

CROSS-REFERENCE TO RELATED APPLICATION(S)

This application claims priority to and the benefit of Korean Patent Application No. 10-2021-0101533 under 35 U.S.C. § 119, filed in the Korean Intellectual Property Office (KIPO) on Aug. 2, 2021, the entire content of which is incorporated herein by reference.

BACKGROUND

1. Technical Field

The disclosure relates to a display apparatus with a reduced size of an non-display area.

2. Description of the Related Art

As the information society has evolved, various demands for a display apparatus for displaying an image have increased. A display apparatus includes a display area where an image is displayed and a non-display area where an image is not displayed. Recently, research to increase a display area of a display apparatus by reducing a non-display area of the display apparatus has been actively conducted.

SUMMARY

A display apparatus may include a display panel, a driving chip for driving the display panel, and a printed circuit board. The driving chip and the printed circuit board may be located in a non-display area of the display panel.

One or more embodiments include a display apparatus in which a non-display area where a driving chip and a printed circuit board are located may be reduced.

Additional aspects of the disclosure will be set forth in part in the following description, or will be apparent in part from the description, or may be learned by practicing embodiments of the disclosure.

According to one or more embodiments, a display apparatus may include a first substrate including a display area, a non-display area at least partially surrounding the display area, and a groove that overlaps the non-display area and is recessed in a thickness direction, a plurality of pixels located on the first substrate and overlapping the display area, a driving chip located in the groove, and a printed circuit board located in the non-display area and overlapping the driving chip in a plan view.

The display apparatus may further include a first pad adjacent to the groove and electrically connected to the printed circuit board, a second pad located in the groove and electrically connected to the driving chip, and a connection wiring extending from the first pad to the second pad, wherein the driving chip and the printed circuit board are electrically connected to each other.

The first pad and the second pad may be disposed parallel to each other in a direction in which an edge of the first substrate extends in a plan view.

The display apparatus may further include a third pad located in the groove and electrically connected to the driving chip, and a fan-out wiring extending from the third pad to the display area, wherein the first pad, the second pad, and the third pad are disposed parallel to one another in a direction in which an edge of the first substrate extends in a plan view.

The groove may include a first edge adjacent to the display area, a second edge between the first pad and the second pad, and a third edge adjacent to an edge of the first substrate, and the connection wiring extends to cross at least one of the first edge and the second edge.

The display apparatus may further include a third pad located in the groove and electrically connected to the driving chip, a fan-out wiring extending from the third pad to the display area, and a data line electrically connected to the fan-out wiring, wherein the data line is electrically connected to at least one of the plurality of pixels.

The non-display area may include a groove area overlapping the groove, and a peripheral area adjacent to the groove area, and a thickness of the first substrate in the groove area is less than a thickness of the first substrate in the peripheral area.

A depth of the groove may be greater than a thickness of the driving chip.

The display apparatus may further include a second substrate facing the first substrate, a display element layer between the first substrate and the second substrate, and an anti-reflection layer located on the second substrate.

The first substrate may include glass.

According to one or more embodiments, a display apparatus includes a first substrate including a display area, a non-display area at least partially surrounding the display area, and a groove that overlaps the non-display area and is recessed in a thickness direction, a plurality of pixels located on the first substrate and overlapping the display area, a driving chip located in the groove, a printed circuit board located in the non-display area, a first pad adjacent to the groove and electrically connected to the printed circuit board, and a second pad located in the groove and electrically connected to the driving chip, wherein the first pad and the second pad are disposed parallel to each other in a direction in which an edge of the first substrate extends in a plan view.

The printed circuit board may overlap the driving chip in a plan view.

The display apparatus may further include a connection wiring extending from the first pad to the second pad, wherein the driving chip and the printed circuit board are electrically connected to each other.

The groove may include a first edge adjacent to the display area, a second edge between the first pad and the second pad, and a third edge adjacent to the edge of the first substrate, and the connection wiring extends to cross at least one of the first edge and the second edge.

The display apparatus may further include a third pad located in the groove and electrically connected to the driving chip, and a fan-out wiring extending from the third pad to the display area, wherein the first pad, the second pad, and the third pad are disposed parallel to one another in a direction in which the edge of the first substrate extends in a plan view.

The display apparatus may further include a data line electrically connected to the fan-out wiring, wherein the data line is electrically connected to at least one of the plurality of pixels.

The non-display area may include a groove area overlapping the groove, and a peripheral area adjacent to the groove area, and a thickness of the first substrate in the groove area is less than a thickness of the first substrate in the peripheral area.

A depth of the groove may be greater than a thickness of the driving chip.

The display apparatus may further include a second substrate facing the first substrate, a display element layer between the first substrate and the second substrate, and an anti-reflection layer located on the second substrate.

The first substrate may include glass.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1:
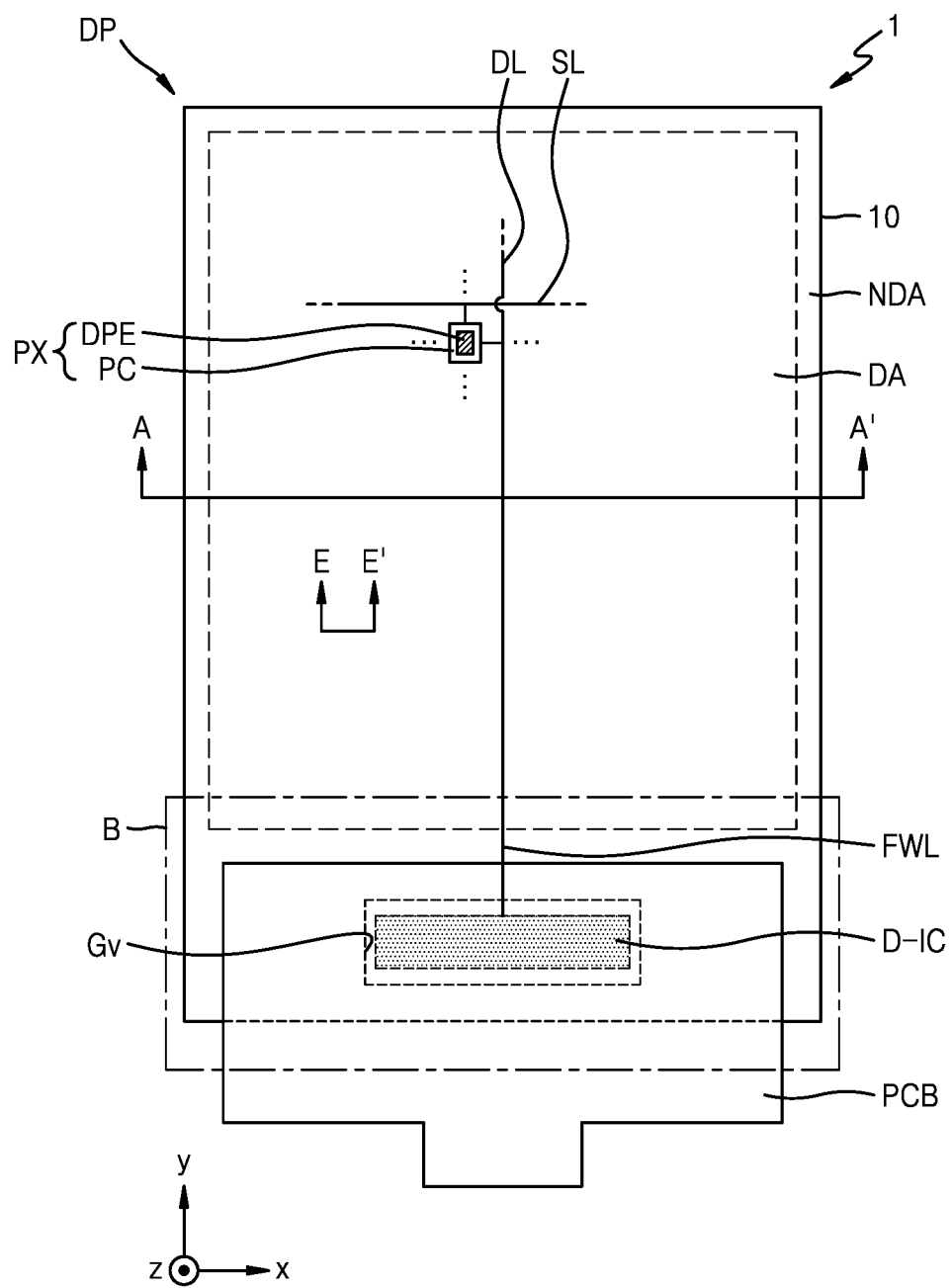
FIG. 1 is a schematic plan view illustrating a display apparatus, according to an embodiment.

Reference will now be made in detail to embodiments, with the accompanying drawings wherein like reference numerals refer to like elements throughout. In this regard, the embodiments may have different forms and should not be construed as being limited to the descriptions set forth herein. Accordingly, the embodiments are merely described below, by referring to the figures, to explain aspects of the disclosure. As used herein, the term "and/or" includes any and all combinations of one or more of the associated listed items. Throughout the disclosure, the expression "at least one of a, b, or c" or "at least one of a, b, and c" indicates only a, only b, only c, both a and b, both a and c, both b and c, all of a, b, and c, or variations thereof.

As the disclosure allows for various changes and numerous embodiments, embodiments will be illustrated in the drawings and described in the detailed description. Effects and features of the disclosure, and methods for achieving the same will be apparent with reference to embodiments described below in detail with the accompanying drawings. However, the disclosure is not limited to the following embodiments disclosed below and may be implemented in various forms.

Reference will now be made in detail to embodiments, examples of which are illustrated in the accompanying drawings, and in the drawings, the same elements are denoted by the same reference numerals, and thus a repeated description thereof will be omitted.

Although the terms "first," "second," and the like may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be further understood that the terms "comprises" or "comprising" used herein specify the presence of stated features or components, but do not preclude the presence or addition of one or more other features or components.

It will be further understood that, when a layer, region, or component is referred to as being "on" another layer, region, or component, it may be directly on the other layer, region, or component, or may be indirectly on the other layer, region, or component with intervening layers, regions, or components therebetween.

Sizes of components in the drawings may be exaggerated or contracted for convenience of explanation. For example, because sizes and thicknesses of elements in the drawings are arbitrarily illustrated for convenience of explanation, the disclosure is not limited thereto.

When an embodiment may be implemented differently, a specific process order may be different from the described order. For example, two consecutively described processes may be performed substantially at the same time or may be performed in an order opposite to the described order.

It will be understood that when a layer, region, or component is referred to as being "connected," the layer, the region, or the component may be directly connected or may be indirectly connected with intervening layers, regions, or components therebetween. For example, when layers, regions, or components are referred to as being "electrically connected," the layers, the regions, or the components may be directly electrically connected, or may be indirectly electrically connected with intervening layers, regions, or components therebetween.

Further, in the specification, the phrase "in a plan view" means when an object portion is viewed from above, and the phrase "in a schematic cross-sectional view" means when a cross-section taken by vertically cutting an object portion is viewed from the side. Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first object may directly or indirectly oppose a second object. In a case in which a third object intervenes between the first and second object, the first and second objects may be understood as being indirectly opposed to one another, although still facing each other.

When a layer, region, substrate, or area, is referred to as being "on" another layer, region, substrate, or area, it may be directly on the other film, region, substrate, or area, or intervening regions, substrates, or areas, may be present therebetween. Conversely, when a layer, region, substrate, or area, is referred to as being "directly on" another layer, region, substrate, or area, intervening layers, regions, substrates, or areas, may be absent therebetween. Further when a layer, region, substrate, or area, is referred to as being "below" another layer, region, substrate, or area, it may be directly below the other layer, region, substrate, or area, or intervening layers, regions, substrates, or areas, may be present therebetween. Conversely, when a layer, region, substrate, or area, is referred to as being "directly below" another layer, region, substrate, or area, intervening layers, regions, substrates, or areas, may be absent therebetween.

Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

A display apparatus that is a device for displaying an image may be a portable mobile device such as a game player, a multimedia device, or a mini personal computer. Embodiments of the display apparatus described below may include a liquid-crystal display, an electrophoretic display, an organic light-emitting display, an inorganic light-emitting display, a field-emission display, a surface-conduction electron-emitter display, a quantum dot display, a plasma display, and a cathode ray display. Although an organic light-emitting display apparatus is used as the display apparatus according to an embodiment, any of various display apparatuses as described above may be used.

FIG. 1 is a schematic plan view illustrating a display apparatus 1, according to an embodiment.

Referring to FIG. 1, the display apparatus 1 may display an image. In an embodiment, the display apparatus 1 may include a display panel DP, a driving chip D-IC, and a printed circuit board PCB. The display panel DP may include a first substrate 10, a pixel PX, a scan line SL, a data line DL, and a fan-out wiring FWL.

In an embodiment, the first substrate 10 may include glass. In another embodiment, the first substrate 10 may include a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. In an embodiment, the first substrate 10 may have a multilayer structure including a base layer including the polymer resin and a barrier layer (not shown). The following will be described assuming that the first substrate 10 includes glass.

The first substrate 10 may include a display area DA and a non-display area NDA. The display area DA may be an area where an image is displayed. The pixel PX may be located in the display area DA. In an embodiment, multiple pixels PX may be arranged in the display area DA.

The non-display area NDA may be an area where an image is not displayed. The non-display area NDA may at least partially surround the display area DA. In an embodiment, the non-display area NDA may entirely surround the display area DA. A driving circuit and/or a power supply wiring of the display panel DP may be located in the non-display area NDA.

A groove Gv may be provided in the first substrate 10. In an embodiment, the groove Gv may overlap the non-display area NDA. In an embodiment, the groove Gv may be spaced apart from the display area DA in a −y direction of FIG. 1. In an embodiment, one groove Gv may overlap the non-display area NDA. In another embodiment, multiple grooves Gv may overlap the non-display area NDA.

The groove Gv may be recessed in a thickness direction of the first substrate 10. For example, the groove Gv may be recessed in a −z direction of FIG. 1. The driving chip D-IC may be provided in the groove Gv.

The pixel PX may be located in the display area DA. The pixel PX may emit light. Accordingly, the display panel DP may display an image by using light emitted from the pixels PX. In an embodiment, the pixels PX may be located on the first substrate 10 and overlap the display area DA. The pixels PX may be arranged in a first direction and/or a second direction that intersects the first direction. For example, an acute angle, a right angle, or an obtuse angle may be formed between the first direction and the second direction. The following will be described in detail assuming that the first direction is an x direction or an −x direction of FIG. 1 and the second direction is a y direction or a −y direction of FIG. 1.

The pixel PX may include a pixel circuit PC and a display element DPE. The pixel circuit PC may be electrically connected to the scan line SL configured to transmit a scan signal and the data line DL configured to transmit a data signal. The pixel circuit PC may receive the scan signal and the data signal and may drive the display element DPE.

In an embodiment, the display element DPE may be an organic light-emitting diode including an organic emission layer. In an embodiment, the display element DPE may be a light-emitting diode (LED). The light-emitting diode may have a micro-scale or nano-scale size. For example, the light-emitting diode may be a micro-light-emitting diode. In an embodiment, the light-emitting diode may be a nanorod light-emitting diode. The nanorod light-emitting diode may include gallium nitride (GaN). In an embodiment, a color conversion layer may be located on the nanorod light-emitting diode. The color conversion layer may include quantum dots. In an embodiment, the display element DPE may be a quantum dot light-emitting diode including a quantum dot emission layer. In an embodiment, the display element DPE may be an inorganic light-emitting diode including an inorganic semiconductor.

The scan line SL may transmit a scan signal. In an embodiment, the scan line SL may extend in the first direction (e.g., the x direction or the −x direction). The scan line SL may be electrically connected to the pixel PX. In an embodiment, the scan line SL may be electrically connected to any one of the pixels PX. In an embodiment, the scan line SL may receive a scan signal from a driving circuit (not shown).

The data line DL may transmit a data signal. In an embodiment, the data line DL may extend in the second direction (e.g., the y direction or the −y direction). The data line DL may be electrically connected to the pixel PX. In an embodiment, the data line DL may be electrically connected to at least one of the pixels PX.

The fan-out wiring FWL may extend from the non-display area NDA to the display area DA. In an embodiment, the fan-out wiring FWL may be electrically connected to the data line DL. In an embodiment, the fan-out wiring FWL and the data line DL may be integral with each other. In another embodiment, the fan-out wiring FWL may be a wiring that is different from the data line DL and is electrically connected to the data line DL.

The fan-out wiring FWL may extend from the display area DA to the groove Gv provided in the non-display area NDA. In an embodiment, the fan-out wiring FWL may be electrically connected to the driving chip D-IC in the groove Gv.

The driving chip D-IC may receive control signals and a power supply voltage. In an embodiment, the driving chip D-IC may generate and output signals and voltages for driving the display panel DP. The signals and/or the voltages generated by the driving chip D-IC may be transmitted through the fan-out wiring FWL. The driving chip D-IC may include an integrated circuit. The driving chip D-IC may be located in the groove Gv. In an embodiment, the driving chip D-IC may be provided in the groove Gv. For example, the driving chip D-IC may be mounted in the groove Gv.

The printed circuit board PCB may be electrically connected to the display panel DP. In an embodiment, the printed circuit board PCB may be electrically connected to the driving chip D-IC. In an embodiment, the printed circuit board PCB may apply control signals and a power supply voltage to the driving chip D-IC. In another embodiment, for example, an integrated circuit may be located on the printed circuit board PCB.

The printed circuit board PCB may be located in the non-display area NDA. In an embodiment, the printed circuit board PCB may overlap the driving chip D-IC in a plan view. Accordingly, in the non-display area NDA, an area occupied by the driving chip D-IC and the printed circuit board PCB may be reduced. For example, the non-display area NDA located at a lower end of the display panel DP may be reduced. Also, an area occupied by the display area DA in the display panel DP may be increased.

In an embodiment, the printed circuit board PCB may be a flexible printed circuit board that may be bent. In another embodiment, the printed circuit board PCB may be a rigid printed circuit board that is rigid, and thus, may not bent well. In other embodiments, the printed circuit board PCB may be a hybrid printed circuit board including both a rigid printed circuit board and a flexible printed circuit board.

Figure 2:
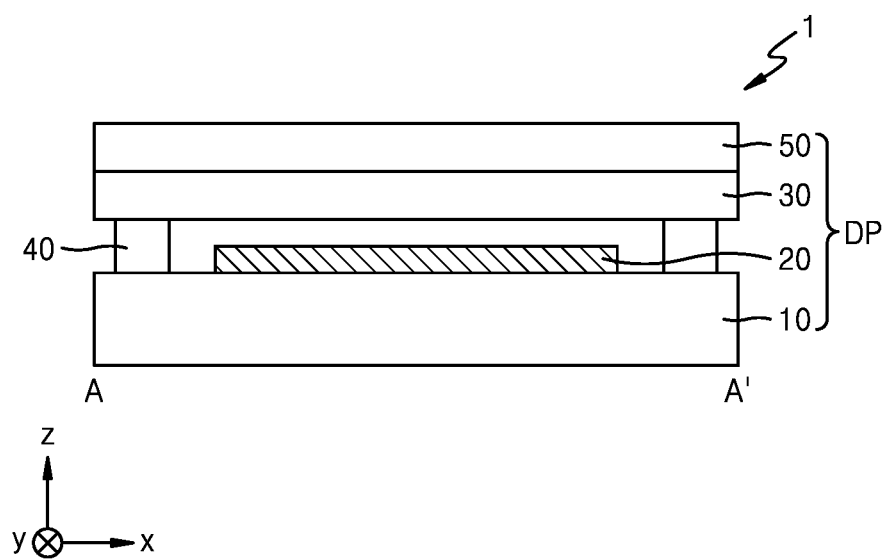
FIG. 2 is a schematic cross-sectional view illustrating the display apparatus taken along line A-A' of FIG. 1.

FIG. 2 is a schematic cross-sectional view illustrating the display apparatus 1 taken along line A-A' of FIG. 1. In FIG. 2, the same components as those in FIG. 1 are denoted by the same reference numerals, and thus a repeated description thereof will be omitted.

Referring to FIG. 2, the display apparatus 1 may include the display panel DP. The display panel DP may include the first substrate 10, a display element layer 20, a second substrate 30, a sealing member 40, and an anti-reflection layer 50.

The display element layer 20 may be located on the first substrate 10. The display element layer 20 may include a display element. In an embodiment, the display element layer 20 may include multiple display elements.

Although not shown in FIG. 2, a pixel circuit layer may be disposed between the display element layer 20 and the first substrate 10. The pixel circuit layer may include a pixel circuit. In an embodiment, the pixel circuit layer may include multiple pixel circuits.

The second substrate 30 may be located on the display element layer 20. In an embodiment, the display element layer 20 may be disposed between the first substrate 10 and the second substrate 30. The second substrate 30 may be a transparent member. In an embodiment, the second substrate 30 may include glass. The first substrate 10 and the second substrate 30 may be connected to each other by the sealing member 40. Accordingly, an inner space between the first substrate 10 and the second substrate 30 may be sealed. A moisture absorbing material and/or a filling material may be located in the inner space.

The sealing member 40 may be disposed between the first substrate 10 and the second substrate 30. The sealing member 40 may be a sealant. In another embodiment, the sealing member 40 may include a material that may be cured by a laser. For example, the sealing member 40 may be a frit. The sealing member 40 may include a urethane resin, an epoxy resin, or an acrylic resin that is an organic sealant, or silicone that is an inorganic sealant. For example, the urethane resin may include urethane acrylate. For example, the acrylic resin may include butyl acrylate and ethylhexyl acrylate. The sealing member 40 may include a material that is cured by heat.

In another embodiment, an encapsulation layer, instead of the second substrate 30, may be located on the display element layer 20. The encapsulation layer may include at least one inorganic encapsulation layer and at least one organic encapsulation layer covering the display element layer 20. In an embodiment, the at least one inorganic encapsulation layer and the at least one organic encapsulation layer may be alternately stacked. The inorganic encapsulation layer may include at least one inorganic material from among aluminum oxide ($Al_2O_3$), titanium oxide ($TiO_2$), tantalum oxide ($Ta_2O_5$), zinc oxide (ZnO), silicon oxide ($SiO_2$), silicon nitride (SiNx), and silicon oxynitride (SiON). The organic encapsulation layer may include a polymer-based material. For example, the polymer-based material may include an acrylic resin, an epoxy resin, polyimide, and polyethylene. In an embodiment, the organic encapsulation layer may include acrylate. In another embodiment, the encapsulation layer and the second substrate 30 may be simultaneously disposed on the display element layer 20.

The anti-reflection layer 50 may be located on the second substrate 30. The anti-reflection layer 50 may reduce a reflectance of light incident on the display apparatus 1. In an embodiment, the anti-reflection layer 50 may include a phase retarder and/or a polarizer. The phase retarder may be a film-type phase retarder or a liquid crystal coating-type phase retarder, and may include a λ/2 phase retarder and/or a λ/4 phase retarder. The polarizer may be a film-type polarizer or a liquid crystal coating-type polarizer. The film-type polarizer may include a stretchable synthetic resin film, and the liquid crystal coating-type polarizer may include liquid crystals arranged in a given or predetermined arrangement. The phase retarder and the polarizer may further include a protective film.

In another embodiment, the anti-reflection layer 50 may include a black matrix and color filters. The color filters may be arranged in consideration of a color of light emitted by each of multiple display elements of the display apparatus 1. Each of the color filters may include a red, green, or blue pigment or dye. In an embodiment, each of the color filters may further include quantum dots in addition to the pigment or dye. In other embodiments, some of the color filters may not include the pigment or dye, and may include scattering particles such as titanium oxide.

In another embodiment, the anti-reflection layer 50 may have a destructive interference structure. The destructive interference structure may include a first reflective layer and a second reflective layer that are located on different layers. First reflected light and second reflected light respectively reflected by the first reflective layer and the second reflective layer may be destructively interfered with each other, thereby reducing a reflectance of external light.

In some embodiments, a touch sensor layer may be disposed between the second substrate 30 and the anti-reflection layer 50. The touch sensor layer may obtain coordinate information according to an external input, e.g., a touch event.

Figure 3:
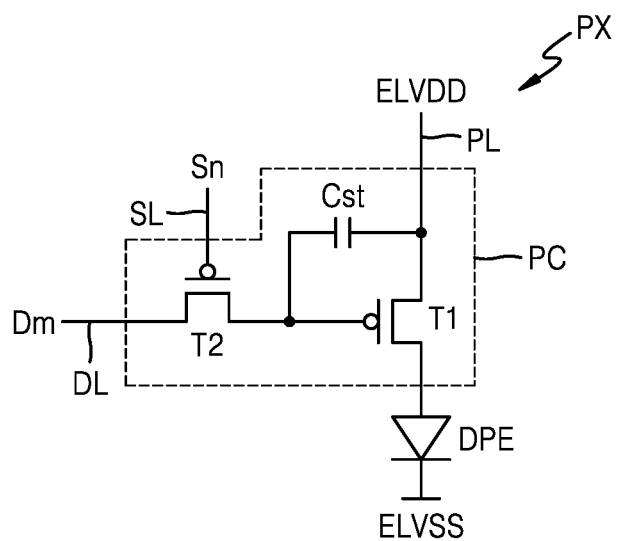
FIG. 3 is an equivalent circuit diagram illustrating one pixel of a display panel.

FIG. 3 is an equivalent circuit diagram illustrating one pixel PX of a display panel.

Referring to FIG. 3, the pixel PX may include the pixel circuit PC and the display element DPE that is electrically connected to the pixel circuit PC. The pixel circuit PC may include a driving thin-film transistor T1, a switching thin-film transistor T2, and a storage capacitor Cst. For example, the pixel PX may emit red light, green light, or blue light, or may emit red light, green light, blue light, or white light, through the display element DPE.

The switching thin-film transistor T2 may be electrically connected to the scan line SL and the data line DL, and may transmit, to the driving thin-film transistor T1, a data voltage or a data signal Dm input from the data line DL according to a scan voltage or a scan signal Sn input from the scan line SL.

The storage capacitor Cst may be electrically connected to the switching thin-film transistor T2 and a driving voltage line PL, and may store a voltage corresponding to a difference between a voltage received from the switching thin-film transistor T2 and a first power supply voltage ELVDD supplied to the driving voltage line PL.

The driving thin-film transistor T1 may be electrically connected to the driving voltage line PL and the storage capacitor Cst, and may control driving current flowing from the driving voltage line PL to the display element DPE in response to a value of a voltage stored in the storage capacitor Cst. The display element DPE may emit light having a luminance due to the driving current. A counter electrode (e.g., a cathode) of the display element DPE may receive a second power supply voltage ELVSS.

Although it is shown in FIG. 3 that the pixel circuit PC includes two thin-film transistors, the pixel circuit PC may include three or more thin-film transistors.

Figure 4:
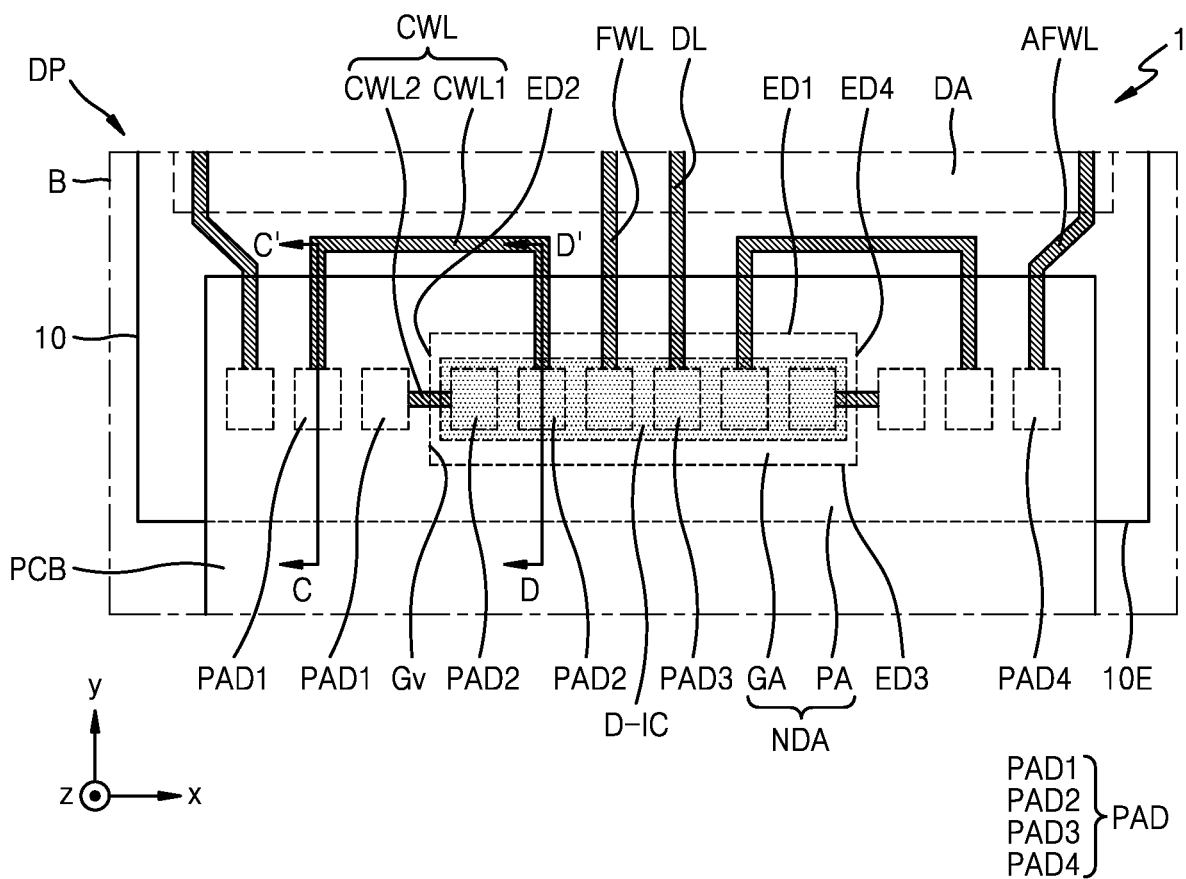
FIG. 4 is a partially enlarged view illustrating portion B of the display apparatus of FIG. 1.

FIG. 4 is a partially enlarged schematic view illustrating portion B of the display apparatus 1 of FIG. 1. In FIG. 4, the same components as those in FIG. 1 are denoted by the same reference numerals, and thus a repeated description thereof will be omitted.

Referring to FIG. 4, the display apparatus 1 may include the display panel DP, the driving chip D-IC, and the printed circuit board PCB. The display panel DP may include the first substrate 10, a pad PAD, a connection wiring CWL, the fan-out wiring FWL, an additional fan-out wiring AFWL, and the data line DL.

In an embodiment, the first substrate 10 may include glass. The first substrate 10 may include the display area DA and the non-display area NDA. The display area DA may be an area where an image is displayed. A pixel may be located in the display area DA. In an embodiment, multiple pixels may be located in the display area DA.

The non-display area NDA may be an area where an image is not displayed. The non-display area NDA may at least partially surround the display area DA. The non-display area NDA may include a groove area GA and a peripheral area PA.

The groove area GA may be an area overlapping the groove Gv in the non-display area NDA. The peripheral area PA may be adjacent to or located outside the groove area GA. In an embodiment, the peripheral area PA may at least partially surround the groove area GA. For example, the peripheral area PA may entirely surround the groove area GA. In an embodiment, the groove area GA may be a portion of the non-display area NDA that is recessed in a thickness direction of the first substrate 10 relative to the peripheral area PA.

The groove Gv may be provided in the first substrate 10. In an embodiment, the groove Gv may overlap the non-display area NDA. In an embodiment, the groove Gv may overlap the groove area GA. The groove Gv may be recessed in the thickness direction of the first substrate 10. For example, the groove Gv may have a shape that is recessed in the −z direction of FIG. 4. The groove Gv may have a shape for receiving the driving chip D-IC.

The groove Gv may include an edge. In an embodiment, the groove area GA and the peripheral area PA may be defined or divided by the edge of the groove Gv as a boundary. In an embodiment, the groove Gv may include a first edge ED1, a second edge ED2, a third edge ED3, and a fourth edge ED4. The first edge ED1 may be adjacent to the display area DA. For example, the display area DA may be located on a side of the first edge ED1. The third edge ED3 may be adjacent to an edge 10E of the first substrate 10. In other words, the third edge ED3 may be between the edge 10E of the first substrate 10 and the first edge ED1. Each of the second edge ED2 and the fourth edge ED4 may extend from an end of the first edge ED1 to an end of the third edge ED3.

The pad PAD may electrically connect an element of the display apparatus 1 to the display panel DP. The pad PAD may be located in the non-display area NDA. In an embodiment, multiple pads PAD may be provided. The pads PAD may be spaced apart from one another. The pads PAD may include a first pad PAD1, a second pad PAD2, a third pad PAD3, and a fourth pad PAD4.

The first pad PAD1 may be located outside the groove Gv. The fourth pad PAD4 may be adjacent to or located outside the groove Gv. For example, the first pad PAD1 and the fourth pad PAD4 may be located in the peripheral area PA. In an embodiment, multiple first pads PAD1 may be provided. In an embodiment, multiple fourth pads PAD4 may be provided.

The second pad PAD2 may be located in the groove Gv. The third pad PAD3 may be located in the groove Gv. For example, the second pad PAD2 and the third pad PAD3 may be located in the groove area GA. In an embodiment, multiple third pads PAD3 may be provided. In an embodiment, multiple fourth pads PAD4 may be provided.

In a plan view, the first pad PAD1 and the second pad PAD2 may be disposed parallel to each other. In an embodiment, in a plan view, the first pad PAD1 and the second pad PAD2 may be disposed parallel to each other along the edge 10E of the first substrate 10. For example, in a plan view, the first pad PAD1 and the second pad PAD2 may be disposed parallel to each other in the first direction (e.g., the x direction the −x direction).

In a plan view, the first pad PAD1, the second pad PAD2, and the third pad PAD3 may be disposed parallel to one another. In an embodiment, in a plan view, the first pad PAD1, the second pad PAD2, and the third pad PAD3 may be disposed parallel to one another along the edge 10E of the first substrate 10. For example, in a plan view, the first pad PAD1, the second pad PAD2, and the third pad PAD3 may be disposed parallel to one another in the first direction (e.g., the x direction or the −x direction).

In a plan view, the first pad PAD1, the second pad PAD2, the third pad PAD3, and the fourth pad PAD4 may be disposed parallel to one another. In an embodiment, in a plan view, the first pad PAD1, the second pad PAD2, the third pad PAD3, and the fourth pad PAD4 may be disposed parallel to one another along the edge 10E of the first substrate 10. Accordingly, in the display panel DP, the area of the non-display area NDA occupied by the pads PAD in the second direction (e.g., the y direction or the −y direction) may be reduced.

The connection wiring CWL may extend from the first pad PAD1 to the second pad PAD2. In an embodiment, the connection wiring CWL may electrically connect the first pad PAD1 to the second pad PAD2. In an embodiment, the connection wiring CWL may extend to the groove Gv. For example, the connection wiring CWL may extend from the peripheral area PA to the groove area GA.

The connection wiring CWL may extend to cross at least one of the first edge ED1 and the second edge ED2. In an embodiment, the second edge ED2 may be disposed between the first pad PAD1 and the second pad PAD2. The fourth edge ED4 may be disposed between the first pad PAD1 and the second pad PAD2. The connection wiring CWL may include a first connection wiring CWL1 and a second connection wiring CWL2. The first connection wiring CWL1 may extend to cross the first edge ED1. For example, the first connection wiring CWL1 may extend from the first pad PAD1 in the second direction (e.g., the y direction or the −y direction). The first connection wiring CWL1 may extend in the first direction (e.g., the x direction or the −x direction). The first connection wiring CWL1 may extend in the −y direction, and may cross the first edge ED1. The second connection wiring CWL2 may extend to cross the second edge ED2. For example, the second connection wiring CWL2 may extend from the first pad PAD1 in the first direction (e.g., the x direction or the −x direction), and may cross the second edge ED2. In an embodiment, the second connection wiring CWL2 may extend to cross the fourth edge ED4. For example, the second connection wiring CWL2 may extend from the first pad PAD1 in the first direction (e.g., the x direction or the −x direction), and may cross the fourth edge ED4.

In an embodiment, the connection wiring CWL may not cross the third edge ED3. Accordingly, the area of the non-display area NDA in the second direction (e.g., the y direction or the −y direction) may be reduced. In some embodiments, the connection wiring CWL may cross the third edge ED3.

The fan-out wiring FWL may extend from the third pad PAD3 to the display area DA. In an embodiment, the fan-out wiring FWL may extend from the groove area GA to the peripheral area PA. The fan-out wiring FWL may extend from the peripheral area PA to the display area DA. In an embodiment, multiple fan-out wirings FWL may be provided.

In an embodiment, the fan-out wiring FWL may be electrically connected to the data line DL. In an embodiment, the fan-out wiring FWL and the data line DL may be integral with each other. In another embodiment, the fan-out wiring FWL may be a wiring that is different from the data line DL and is electrically connected to the data line DL.

The additional fan-out wiring AFWL may extend from the fourth pad PAD4. For example, the additional fan-out wiring AFWL may extend from the fourth pad PAD4 to the display area DA. In an embodiment, multiple additional fan-out wirings AFWL may be provided.

The driving chip D-IC may be located in the groove Gv. In an embodiment, the driving chip D-IC may be provided in the groove Gv. The driving chip D-IC may be mounted in the groove Gv. The driving chip D-IC may be electrically connected to the second pad PAD2. The driving chip D-IC may be electrically connected to the third pad PAD3.

Accordingly, signals and/or voltages generated by the driving chip D-IC may be transmitted through the fan-out wiring FWL.

The printed circuit board PCB may be located in the non-display area NDA. In an embodiment, the printed circuit board PCB may overlap the driving chip D-IC in a plan view. Accordingly, in the non-display area NDA, an area occupied by the driving chip D-IC and the printed circuit board PCB may be reduced. For example, the non-display area NDA located at a lower end of the display panel DP may be reduced.

The printed circuit board PCB may be electrically connected to the display panel DP. The printed circuit board PCB may be electrically connected to the first pad PAD1. Accordingly, the printed circuit board PCB and the driving chip D-IC may be electrically connected to each other. For example, the printed circuit board PCB and the driving chip D-IC may be electrically connected to each other through the first pad PAD1, the connection wiring CWL, and the second pad PAD2. Accordingly, the printed circuit board PCB may transmit control signals and/or a power supply voltage to the driving chip D-IC.

The printed circuit board PCB may be electrically connected to the fourth pad PAD4. Accordingly, signals and/or voltages generated by the printed circuit board PCB may be transmitted through the additional fan-out wiring AFWL. In other embodiments, a signal generated by the display panel DP may be transmitted to the printed circuit board PCB through the additional fan-out wiring AFWL. For example, coordinate information obtained by the display panel DP may be transmitted to the printed circuit board PCB through the additional fan-out wiring AFWL.

Figure 5:
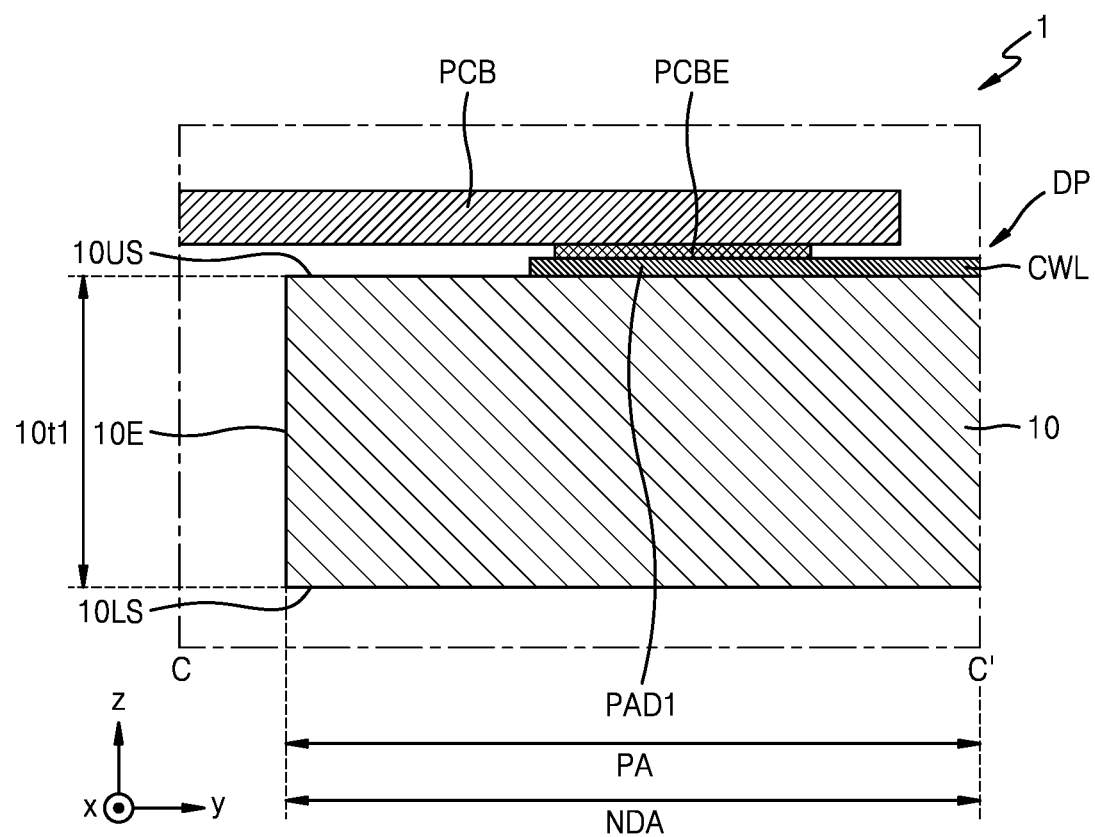
FIG. 5 is a schematic cross-sectional view illustrating the display apparatus taken along line C-C' of FIG. 4.
Figure 6:
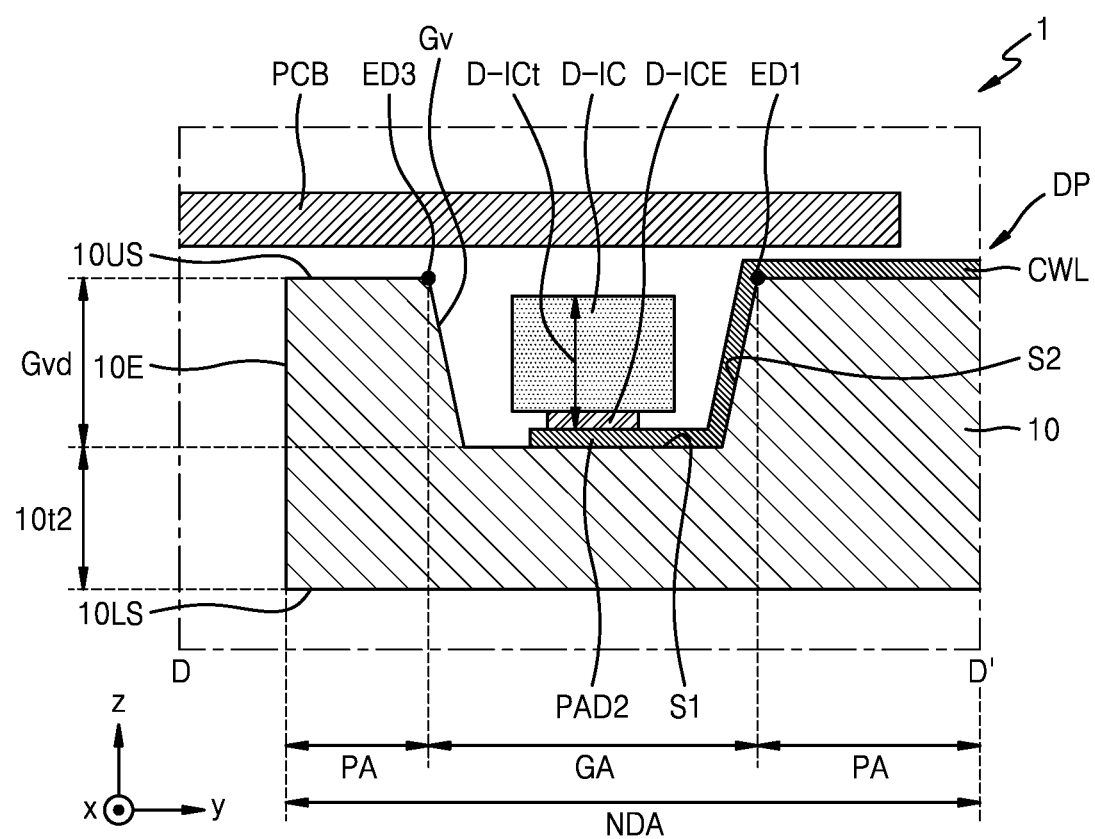
FIG. 6 is a schematic cross-sectional view illustrating the display apparatus taken along line D-D' of FIG. 4.

FIG. 5 is a schematic cross-sectional view illustrating the display apparatus 1 taken along line C-C' of FIG. 4. FIG. 6 is a schematic cross-sectional view illustrating the display apparatus 1 taken along line D-D' of FIG. 4. In FIGS. 5 and 6, the same components as those in FIG. 4 are denoted by the same reference numerals, and thus a repeated description thereof will be omitted.

Referring to FIGS. 5 and 6, the display apparatus 1 may include the display panel DP, the driving chip D-IC, and the printed circuit board PCB. The display panel DP may include the first substrate 10, a pad, and the connection wiring CWL.

The first substrate 10 may include a top surface 10US and a bottom surface 10LS. The top surface 10US of the first substrate 10 and the bottom surface 10LS of the first substrate 10 may be opposite to each other. The first substrate 10 may include the edge 10E. The edge 10E of the first substrate 10 may extend from the top surface 10US of the first substrate 10 to the bottom surface 10LS of the first substrate 10. The edge 10E of the first substrate 10 may connect the top surface 10US of the first substrate 10 to the bottom surface 10LS of the first substrate 10.

The first substrate 10 may include a display area and the non-display area NDA. The non-display area NDA may at least partially surround the display area. The non-display area NDA may include the groove area GA and the peripheral area PA.

The groove area GA may overlap the groove Gv in the non-display area NDA. The peripheral area PA may be adjacent to or located outside the groove area GA. In an embodiment, the peripheral area PA may at least partially surround the groove area GA. In an embodiment, the groove area GA may be a portion of the non-display area NDA that is recessed in a thickness direction of the first substrate 10 relative to the peripheral area PA. The groove area GA may be a portion of the non-display area NDA where the top surface 10US of the first substrate 10 is recessed relative to the peripheral area PA.

A thickness 10t2 of the first substrate 10 in the groove area GA may be less than a thickness 10t1 of the first substrate 10 in the peripheral area PA. The thickness 10t2 of the first substrate 10 in the groove area GA may be a distance between the top surface 10US of the first substrate 10 and the bottom surface 10LS of the first substrate 10 in the groove area GA. The thickness 10t1 of the first substrate 10 in the peripheral area PA may be a distance between the top surface 10US of the first substrate 10 and the bottom surface 10LS of the first substrate 10 in the peripheral area PA.

The groove Gv may be provided in the first substrate 10. In an embodiment, the groove Gv may overlap the non-display area NDA. In an embodiment, the groove Gv may overlap the groove area GA. The groove Gv may be recessed in the thickness direction of the first substrate 10. For example, the groove Gv may have a shape that is recessed in the −z direction of FIG. 6. The groove Gv may have a shape for receiving the driving chip D-IC. In an embodiment, the groove Gv may be formed by performing wet etching and/or dry etching on the first substrate 10. In an embodiment, the groove Gv may be formed by performing wet etching and then performing dry etching on the first substrate 10.

In an embodiment, the groove Gv may be defined by a first surface S1 and a second surface S2. The first surface S1 and the second surface S2 may be a portion of the top surface 10US of the first substrate 10 overlapping the groove area GA. The first surface S1 may be a portion of the top surface 10US of the first substrate 10 which is closest to the bottom surface 10LS of the first substrate 10. In an embodiment, the first surface S1 may be flat. In an embodiment, a depth Gvd of the groove Gv may be a distance between the first surface S1 and the top surface 10US of the first substrate 10 in the peripheral area PA in the z direction of FIG. 6. In an embodiment, a sum of the depth Gvd of the groove Gv and the thickness 10t2 of the first substrate 10 in the groove area GA may be the thickness 10t1 of the first substrate 10 in the peripheral area PA. The second surface S2 may extend from the first surface S1 to the top surface 10US of the first substrate 10 in the peripheral area PA. In an embodiment, the second surface S2 may be inclined.

The groove Gv may include an edge. In an embodiment, the edge of the groove Gv may be a portion where the second surface S2 and the top surface 10US of the first substrate 10 in the peripheral area PA meet each other. In an embodiment, the groove area GA and the peripheral area PA may be defined or divided by the edge of the groove Gv as a boundary. In an embodiment, the groove Gv may be defined by the first edge ED1 and the third edge ED3. The first edge ED1 may be adjacent to the display area. The third edge ED3 may be adjacent to the edge 10E of the first substrate 10. For example, the third edge ED3 may be between the edge 10E of the first substrate 10 and the first edge ED1.

The pad may electrically connect an element of the display apparatus 1 to the display panel DP. The pad may be located in the non-display area NDA. In an embodiment, multiple pads may be provided. The pads may be spaced apart from one another. In an embodiment, the pads may include the first pad PAD1 and the second pad PAD2.

The first pad PAD1 may be adjacent to or located outside the groove Gv. For example, the first pad PAD1 may be located in the peripheral area PA. The second pad PAD2 may be located in the groove Gv. For example, the second pad PAD2 may be located in the groove area GA.

The connection wiring CWL may extend from the first pad PAD1 to the second pad PAD2. In an embodiment, the connection wiring CWL may electrically connect the first pad PAD1 to the second pad PAD2. In an embodiment, the connection wiring CWL may extend to the groove Gv. For example, the connection wiring CWL may extend to the groove area GA from the peripheral area PA. The connection wiring CWL may extend from the top surface 10US of the first substrate 10 in the peripheral area PA to the second surface S2. The connection wiring CWL may extend from the second surface S2 to the first surface S1.

Although not shown in FIGS. 5 and 6, a fan-out wiring may extend to the groove Gv. For example, the fan-out wiring may extend to the groove area GA from the peripheral area PA. The fan-out wiring may extend from the top surface 10US of the first substrate 10 in the peripheral area PA to the second surface S2. The fan-out wiring may extend from the second surface S2 to the first surface S1.

The connection wiring CWL, the first pad PAD1, and the second pad PAD2 are integrally with each other in FIGS. 5 and 6. In another embodiment, the connection wiring CWL and at least one of the first pad PAD1 and the second pad PAD2 are not integrally with each other. The connection wiring CWL may be a wiring that is different from at least one of the first pad PAD1 and the second pad PAD2, and may be electrically connected to the first pad PAD1 and the second pad PAD2.

The driving chip D-IC may be located in the groove Gv. In an embodiment, the driving chip D-IC may be provided in the groove Gv. The driving chip D-IC may be mounted in the groove Gv. In an embodiment, the driving chip D-IC may include a driving chip electrode D-ICE. The driving chip electrode D-ICE may be electrically connected to the second pad PAD2. In an embodiment, the driving chip electrode D-ICE and the second pad PAD2 may be electrically connected to each other through an anisotropic conductive film. In another embodiment, the driving chip electrode D-ICE and the second pad PAD2 may be electrically connected to each other by soldering. In another embodiment, the driving chip electrode D-ICE and the second pad PAD2 may be directly electrically connected to each other. For example, a part of the driving chip electrode D-ICE and a part of the second pad PAD2 may be melted and adhered to each other.

In an embodiment, a thickness D-ICt of the driving chip D-IC may be less than the depth Gvd of the groove Gv. The thickness D-ICt of the driving chip D-IC may be a distance between a bottom surface of the driving chip electrode D-ICE and a top surface of the driving chip D-IC in the z direction of FIG. 6. The depth Gvd of the groove Gv may be greater than the thickness D-ICt of the driving chip D-IC. Accordingly, the driving chip D-IC may be entirely provided in the groove Gv.

The printed circuit board PCB may be located in the non-display area NDA. In an embodiment, the printed circuit board PCB may overlap the driving chip D-IC in a plan view. Accordingly, in the non-display area NDA, an area occupied by the driving chip D-IC and the printed circuit board PCB may be reduced. For example, the non-display area NDA located at a lower end of the display panel DP may be reduced.

The printed circuit board PCB may be electrically connected to the display panel DP. In an embodiment, the printed circuit board PCB may include a printed circuit board electrode PCBE. The printed circuit board electrode PCBE may be electrically connected to the first pad PAD1. In an embodiment, the printed circuit board electrode PCBE and the first pad PAD1 may be electrically connected to each other through an anisotropic conductive film. In another embodiment, the printed circuit board electrode PCBE and the first pad PAD1 may be electrically connected to each other by soldering. In another embodiment, the printed circuit board electrode PCBE and the first pad PAD1 may be directly electrically connected to each other. For example, a part of the printed circuit board electrode PCBE and a part of the first pad PAD1 may be melted and adhered to each other.

The printed circuit board PCB and the driving chip D-IC may be electrically connected to each other. For example, the printed circuit board PCB and the driving chip D-IC may be electrically connected to each other through the first pad PAD1, the connection wiring CWL, and the second pad PAD2. Accordingly, the printed circuit board PCB may apply control signals and/or a power supply voltage to the driving chip D-IC.

Figure 7:
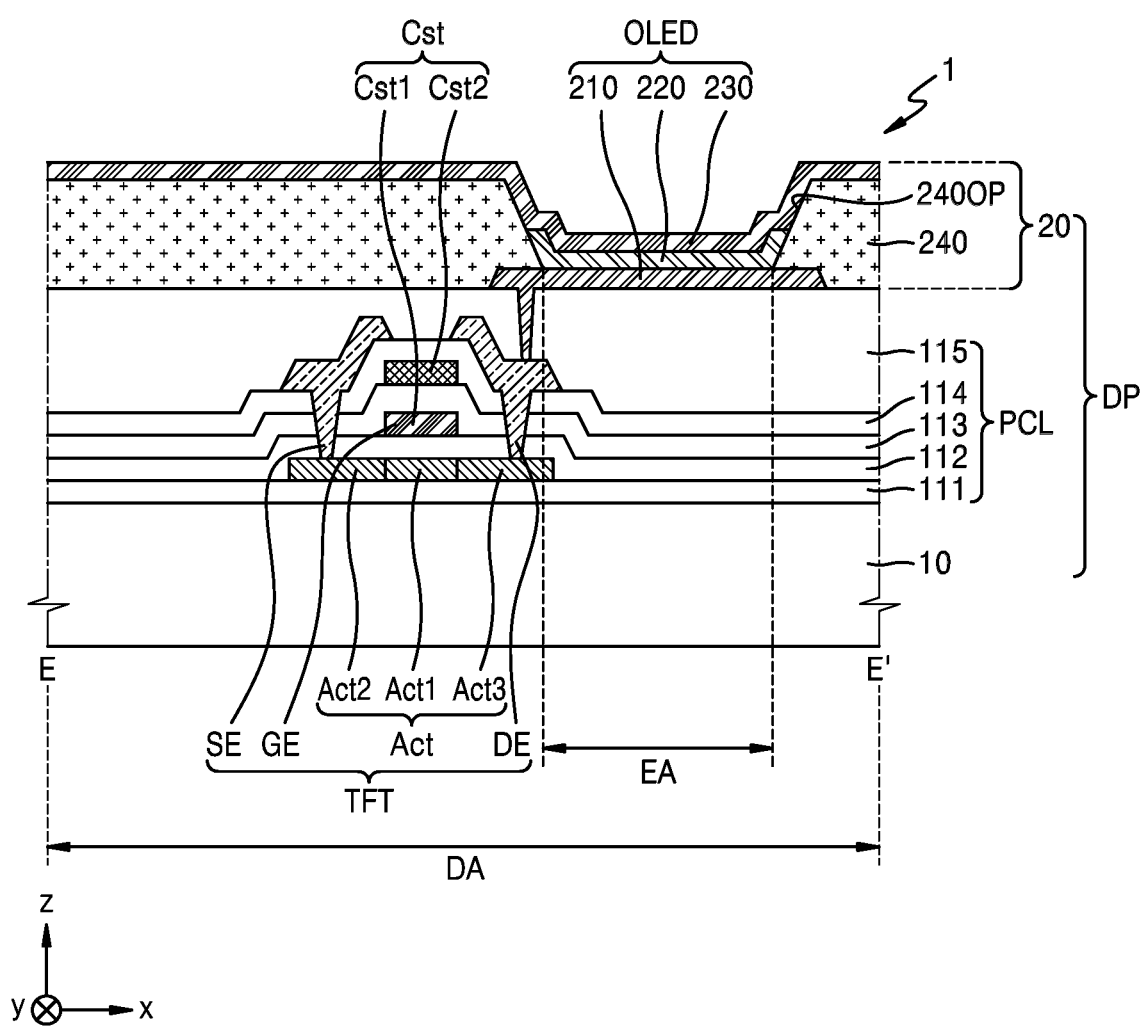
FIG. 7 is a schematic cross-sectional view illustrating the display apparatus taken along line E-E' of FIG. 1.

FIG. 7 is a schematic cross-sectional view illustrating the display apparatus 1 taken along line E-E' of FIG. 1.

Referring to FIG. 7, the display apparatus 1 may include the display panel DP. The display panel DP may include the first substrate 10, a pixel circuit layer PCL, and the display element layer 20. The pixel circuit layer PCL and the display element layer 20 may be sequentially disposed on the first substrate 10.

In an embodiment, the first substrate 10 may include the display area DA.

A barrier layer (not shown) may be further disposed between the pixel circuit layer PCL and the first substrate 10. The barrier layer for preventing penetration of an external foreign material may have a single or multi-layer structure including an inorganic material such as silicon nitride ($SiN_x$) or silicon oxide ($SiO_2$).

The pixel circuit layer PCL may be located on the first substrate 10. The pixel circuit layer PCL may include a thin-film transistor TFT and a buffer layer 111, a first gate insulating layer 112, a second gate insulating layer 113, an interlayer insulating layer 114, and an organic insulating layer 115 located under and/or over elements of the thin-film transistor TFT.

The buffer layer 111 may be located on the first substrate 10. The buffer layer 111 may include an inorganic insulating material such as silicon nitride ($SiN_x$), silicon oxynitride (SiON), or silicon oxide ($SiO_2$), and may have a single or multi-layer structure including the inorganic insulating material.

The thin-film transistor TFT may include a semiconductor layer Act, a gate electrode GE, a source electrode SE, and a drain electrode DE. The semiconductor layer Act may include polysilicon. In an embodiment, the semiconductor layer Act may include amorphous silicon, an oxide semiconductor, or an organic semiconductor. The semiconductor layer Act may include a channel region Act1, and a source region Act2 and a drain region Act3 located on both sides of the channel region Act1.

The gate electrode GE may overlap the channel region Act1. The gate electrode GE may include a low-resistance metal material. The gate electrode GE may include a conductive material including molybdenum (Mo), aluminum (Al), copper (Cu), or titanium (Ti), and may have a single or multi-layer structure including the above material.

The first gate insulating layer 112 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

The second gate insulating layer 113 may cover the gate electrode GE. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO), like the first gate insulating layer 112.

An upper electrode Cst2 of the storage capacitor Cst may be located on the second gate insulating layer 113. The upper electrode Cst2 may overlap the gate electrode GE located under the upper electrode Cst2. For example, the gate electrode GE and the upper electrode Cst2 overlapping each other with the second gate insulating layer 113 therebetween may constitute the storage capacitor Cst. The gate electrode GE may function as a lower electrode Cst1 of the storage capacitor Cst. The storage capacitor Cst and the thin-film transistor TFT may overlap each other. In some embodiments, the storage capacitor Cst may not overlap the thin-film transistor TFT.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layer structure including the above material.

The interlayer insulating layer 114 may cover the upper electrode Cst2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 114 may have a single or multi-layer structure including the above inorganic insulating material.

Each of the source electrode SE and the drain electrode DE may be located on the interlayer insulating layer 114. Each of the source electrode SE and the drain electrode DE may include a material having high conductivity. Each of the source electrode SE and the drain electrode DE may include a conductive material including molybdenum (Mo), aluminum (Al), copper (Cu), or titanium (Ti), and may have a single or multi-layer structure including the above material. In an embodiment, each of the source electrode SE and the drain electrode DE may have a multi-layer structure including Ti/Al/Ti.

The organic insulating layer 115 may include an organic insulating layer. The organic insulating layer 115 may include an organic insulating material such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The display element layer 20 may be located on the pixel circuit layer PCL. The display element layer 20 may include an organic light-emitting diode OLED that is a display element and a pixel-defining film 240. For example, the organic light-emitting diode OLED may emit red, green, or blue light, or may emit red, green, blue, or white light. The organic light-emitting diode OLED may include a pixel electrode 210, an emission layer 220, and a counter electrode 230.

The pixel electrode 210 may be located on the organic insulating layer 115. The pixel electrode 210 may be electrically connected to the thin-film transistor TFT through a contact hole of the organic insulating layer 115. The pixel electrode 210 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 210 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 210 may further include a film formed of ITO, IZO, ZnO, or $In_2O_3$ over/under the reflective film.

The pixel-defining film 240 having an opening 240OP through which a central portion of the pixel electrode 210 is exposed may be located on the pixel electrode 210. The pixel-defining film 240 may include an organic insulating material and/or an inorganic insulating material. The opening 240OP may define an emission area EA of light emitted by the organic light-emitting diode OLED. For example, a width of the opening 240OP may be a width of the emission area EA.

The emission layer 220 may be located in the opening 240OP of the pixel-defining film 240. The emission layer 220 may include a high molecular weight organic material or a low molecular weight organic material emitting light of a color. Although not shown in FIG. 7, a first functional layer and a second functional layer may be respectively disposed under and over the emission layer 220. For example, the first functional layer may include a hole transport layer (HTL), or may include a hole transport layer and a hole injection layer (HIL). The second functional layer that is disposed over the emission layer 220 may be optional. The second functional layer may include an electron transport layer (ETL) and/or an electron injection layer (EIL). The first functional layer and/or the second functional layer may be a common layer entirely covering the first substrate 10, like the counter electrode 230 described below.

The counter electrode 230 may be located on the emission layer 220. The counter electrode 230 may be formed of a conductive material having a low work function. For example, the counter electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the counter electrode 230 may further include a layer formed of ITO, IZO, ZnO, or $In_2O_3$ on the (semi)transparent layer including the above material.

Figure 8:
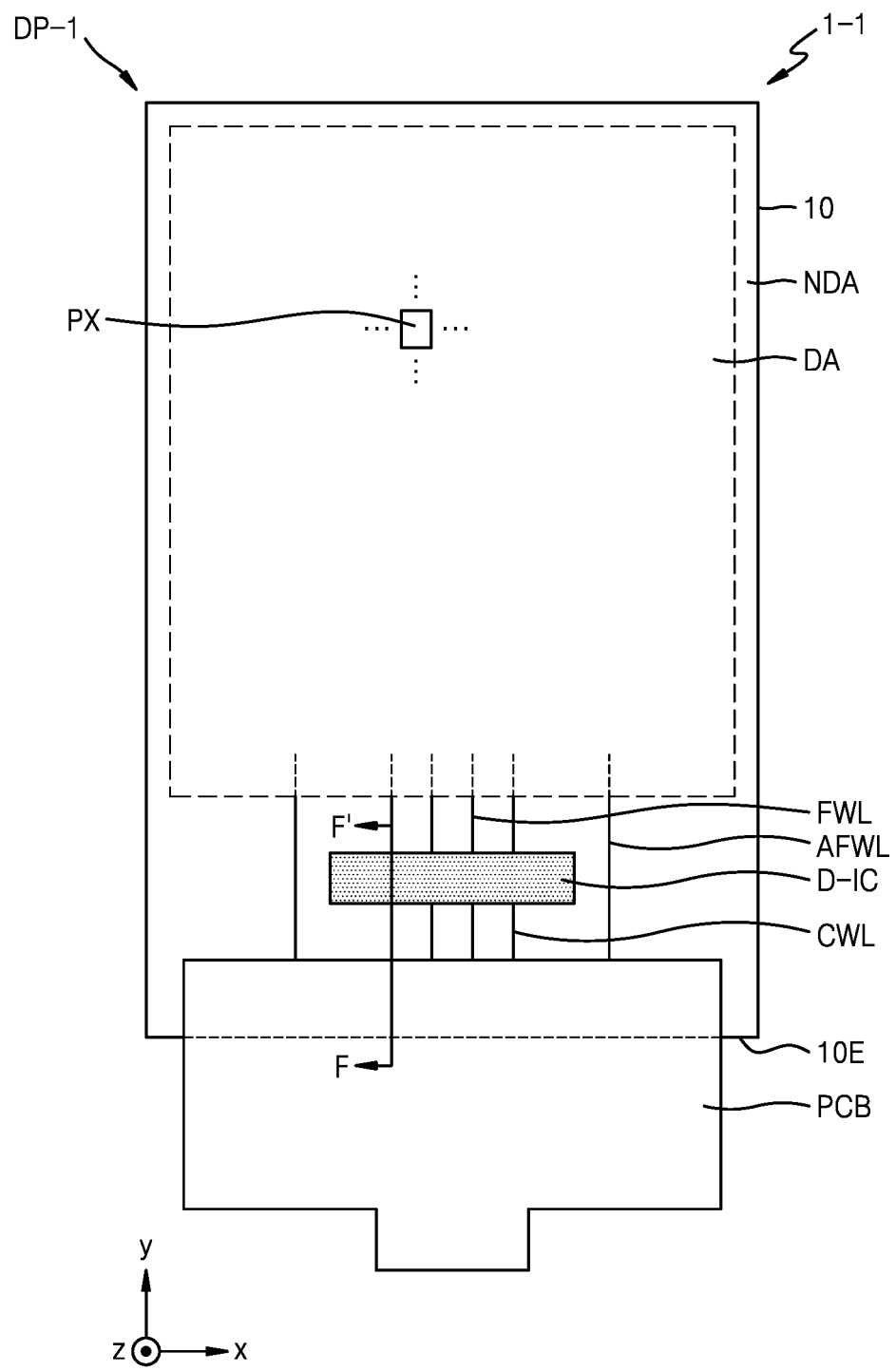
FIG. 8 is a schematic plan view illustrating a display apparatus, according to a comparative example.
Figure 9:
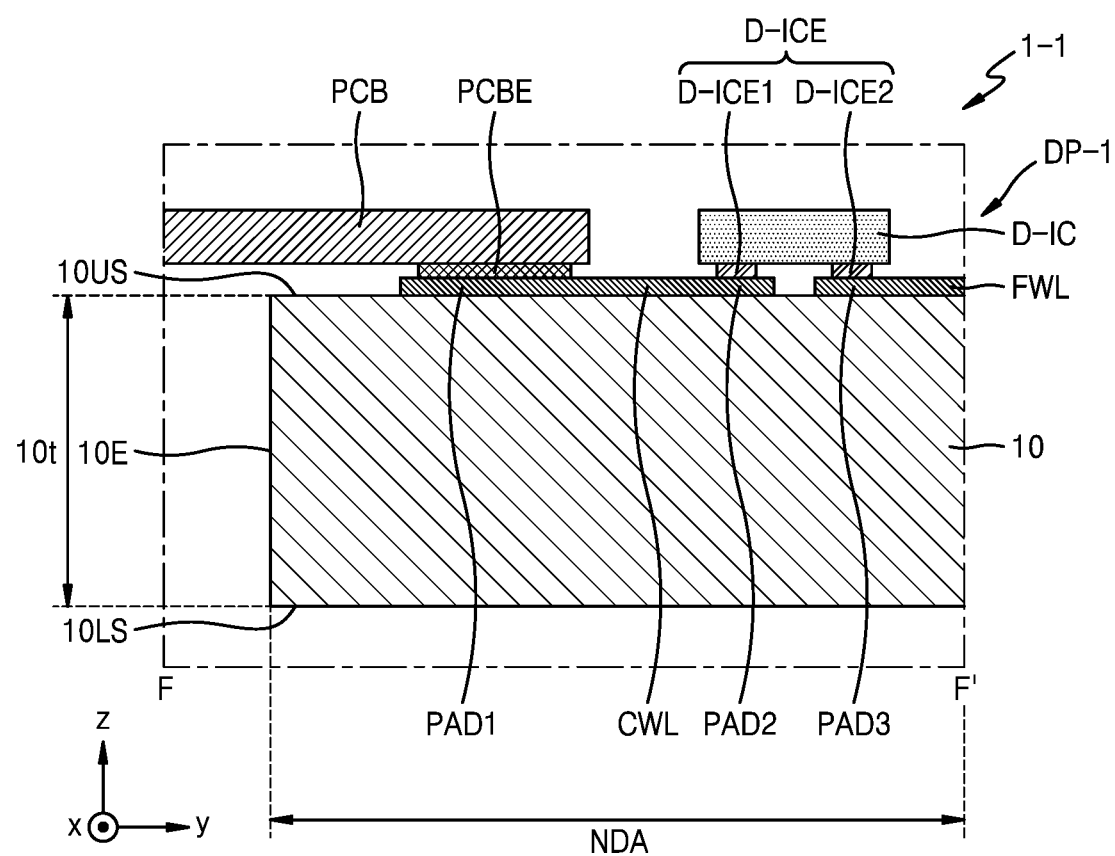
FIG. 9 is a schematic cross-sectional view illustrating the display apparatus taken along line F-F' of FIG. 8.

FIG. 8 is a schematic plan view illustrating a display apparatus 1-1, according to a comparative example. FIG. 9 is a schematic cross-sectional view illustrating the display apparatus 1-1 taken along line F-F' of FIG. 8.

Referring to FIGS. 8 and 9, the display apparatus 1-1 may include a display panel DP-1, the driving chip D-IC, and the printed circuit board PCB. The display panel DP-1 may include the first substrate 10, the pixel PX, the first pad PAD1, the second pad PAD2, the third pad PAD3, the connection wiring CWL, the fan-out wiring FWL, and the additional fan-out wiring AFWL.

The first substrate 10 may include the display area DA and the non-display area NDA. In the comparative example, the first substrate 10 may not include a groove in the non-display area NDA. For example, a thickness 10t of the first substrate 10 in the non-display area NDA may be constant. The top surface 10US of the first substrate 10 and the bottom surface 10LS of the first substrate 10 may extend in the first direction (e.g., the x direction or the −x direction) and/or the second direction (e.g., the y direction or the −y direction).

The first pad PAD1, the second pad PAD2, and the third pad PAD3 may be disposed parallel to one another in the second direction (e.g., the y direction or the −y direction).

The driving chip D-IC may be located on the top surface 10US of the first substrate 10. The driving chip D-IC may include the driving chip electrode D-ICE. In the comparative example, the driving chip electrode D-ICE may include a first driving chip electrode D-ICE1 and a second driving chip electrode D-ICE2. The first driving chip electrode D-ICE1 may be electrically connected to the second pad PAD2. The second driving chip electrode D-ICE2 may be electrically connected to the third pad PAD3.

The printed circuit board PCB may be disposed parallel to the driving chip D-IC. The printed circuit board PCB and the driving chip D-IC may be disposed parallel to each other in the second direction (e.g., the y direction or the −y direction). The printed circuit board PCB may include the printed circuit board electrode PCBE. The printed circuit board electrode PCBE may be electrically connected to the first pad PAD1.

In the comparative example, the driving chip D-IC and the printed circuit board PCB may be disposed parallel to each other in the second direction (e.g., the y direction or the −y direction). Accordingly, a length of the non-display area NDA in the second direction (e.g., the y direction or the −y direction) may be increased.

However, referring back to FIG. 1, the first substrate 10 may include a groove that overlaps the non-display area NDA and is recessed in a thickness direction. The driving chip D-IC may be provided in the groove. Accordingly, a length of the non-display area NDA in the second direction (e.g., the y direction or the −y direction) may be reduced.

Figure 10A:
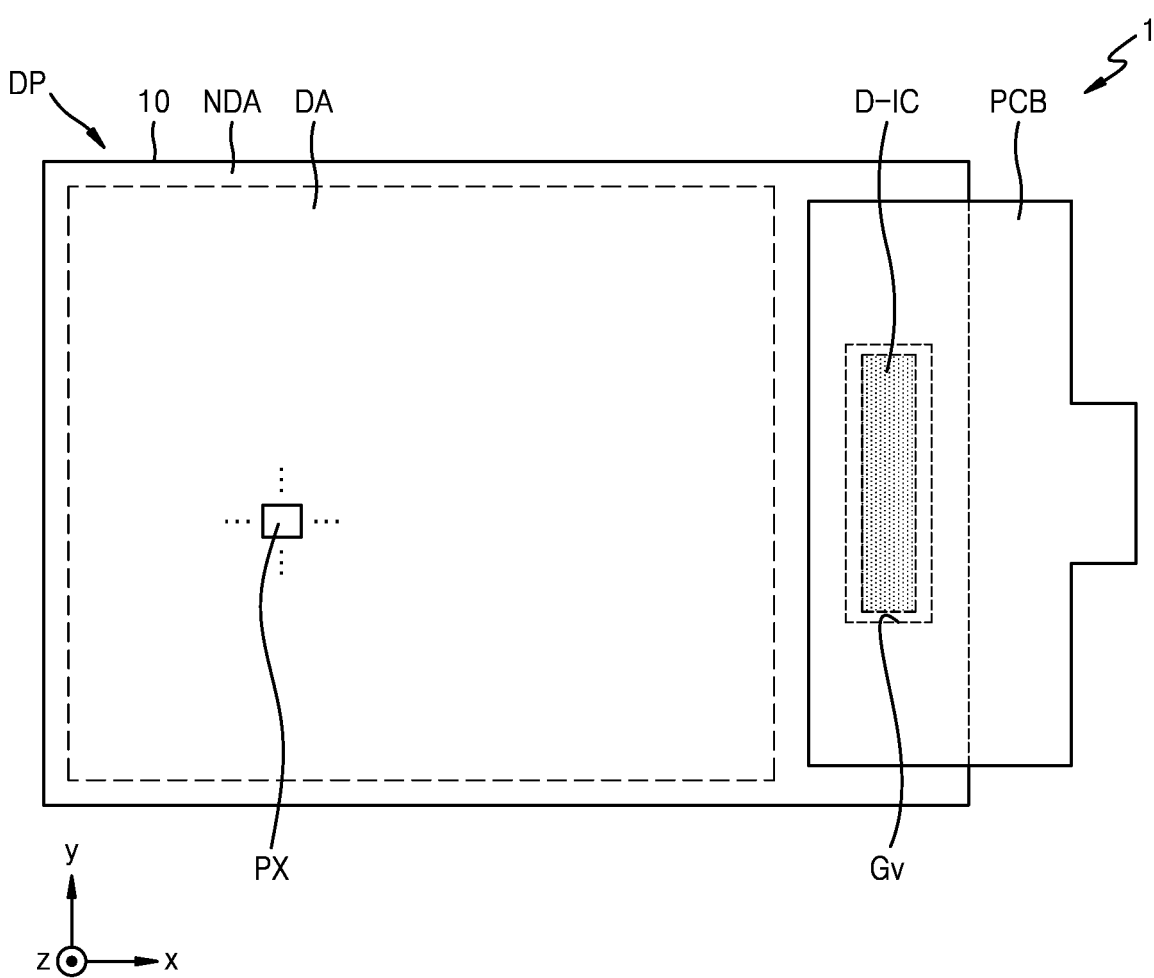
FIGS. 10A, 10B, and 10C are schematic plan views illustrating the display apparatus, according to various embodiments.
Figure 10B:
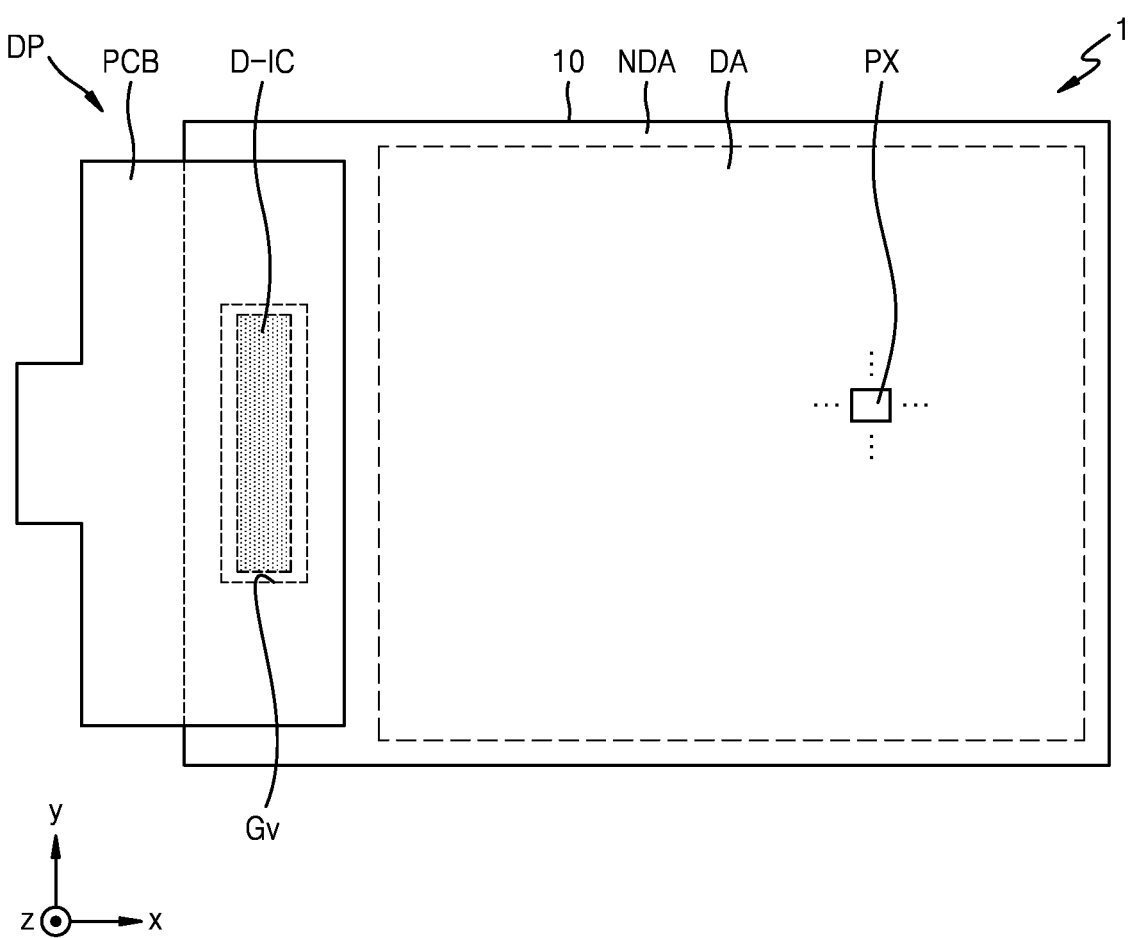
Figure 10C:
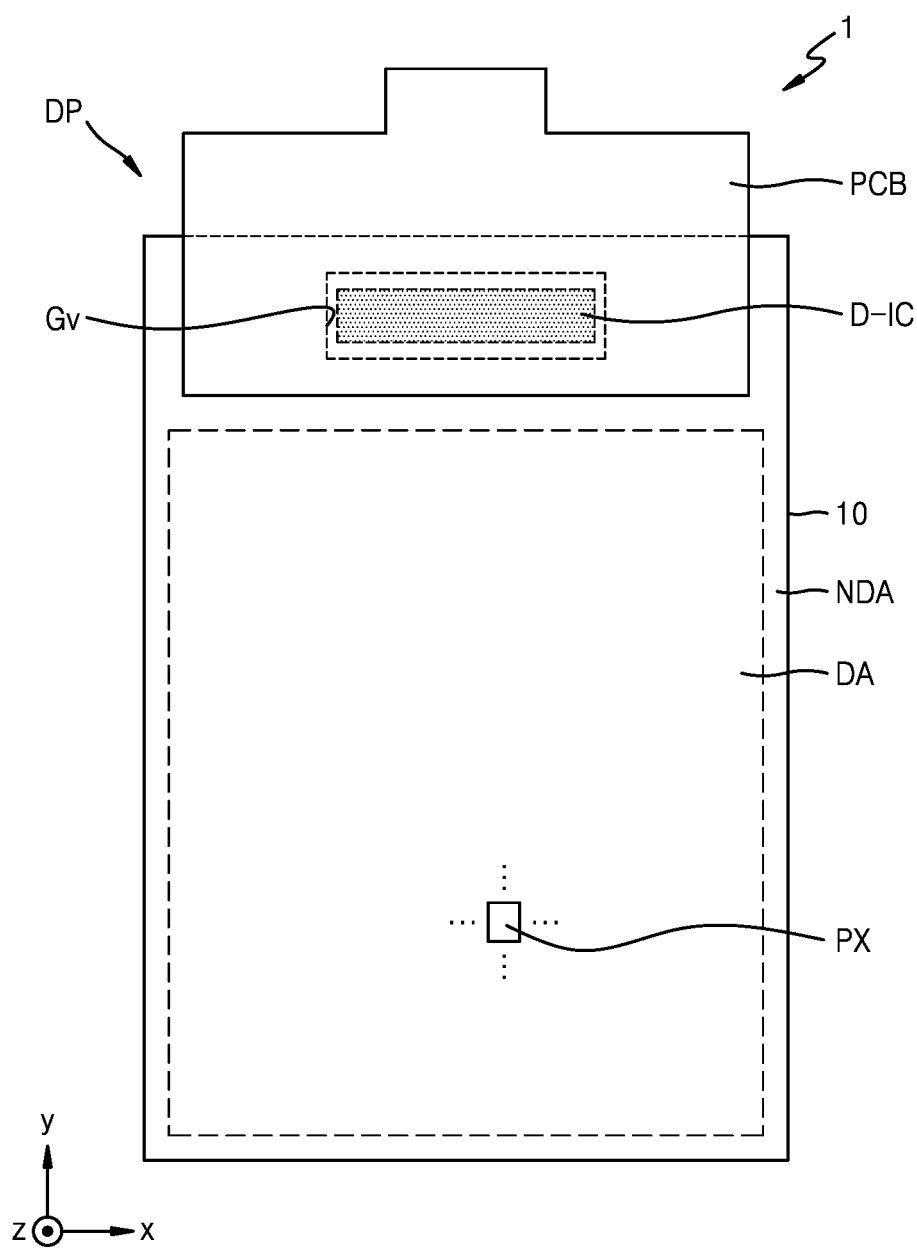

FIGS. 10A, 10B, and 10C are schematic plan views illustrating the display apparatus 1, according to various embodiments. In FIGS. 10A, 10B, and 10C, the same components as those in FIG. 1 are denoted by the same reference numerals, and thus a repeated description thereof will be omitted.

Referring to FIGS. 10A, 10B, and 10C, the display apparatus 1 may include the display panel DP, the driving chip D-IC, and the printed circuit board PCB. The display panel DP may include the first substrate 10 and the pixel PX.

The first substrate 10 may include the display area DA and the non-display area NDA. The display area DA may be an area where the display panel DP displays an image. The pixel PX may be located in the display area DA. The non-display area NDA may be an area where an image is not displayed.

The groove Gv may be provided in the first substrate 10. The groove Gv may be recessed in a thickness direction of the first substrate 10. The groove Gv may receive the driving chip D-IC. In an embodiment, the groove Gv may overlap the non-display area NDA. Referring to FIG. 10A, the groove Gv may be spaced apart from the display area DA in the x direction of FIG. 10A. Referring to FIG. 10B, the groove Gv may be spaced apart from the display area DA in the −x direction of FIG. 10B. Referring to FIG. 10C, the groove Gv may be spaced apart from the display area DA in the y direction of FIG. 10C. A location of the groove Gv may be changed in various ways.

As described above, a display apparatus according to the one or more embodiments may include a first substrate including a groove that overlaps a non-display area and is recessed in a thickness direction, and a driving chip that is located in the groove. Accordingly, the non-display area of the display apparatus may be reduced, and a display area may be increased.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display apparatus comprising:
a first substrate having an integral single-piece form, the first substrate comprising:
a display area;
a non-display area at least partially surrounding the display area; and
a groove that overlaps the non-display area and is recessed in a thickness direction partially through the first substrate;
a plurality of pixels located on the first substrate and overlapping the display area;
a driving chip located in the groove such that at least a bottom surface of the driving chip is below a top surface of the first substrate; and
a printed circuit board located in the non-display area and overlapping the driving chip in a plan view;
a first pad adjacent to the groove and electrically connected to the printed circuit board;
a second pad located in the groove, directly contacting a bottom surface of the groove, and electrically connected to the driving chip; and
a connection wiring directly contacting the bottom surface of the groove and extending from the first pad to the second pad,
wherein the driving chip and the printed circuit board are electrically connected to each other.

2. The display apparatus of claim 1, wherein the first pad and the second pad are disposed parallel to each other in a direction in which an edge of the first substrate extends in a plan view.

3. The display apparatus of claim 1, further comprising:
a third pad located in the groove and electrically connected to the driving chip; and
a fan-out wiring extending from the third pad to the display area, wherein
the first pad, the second pad, and the third pad are disposed parallel to one another in a direction in which an edge of the first substrate extends in a plan view.

4. The display apparatus of claim 1, wherein
the groove comprises:
a first edge adjacent to the display area;
a second edge between the first pad and the second pad; and
a third edge adjacent to an edge of the first substrate, and
the connection wiring extends to cross at least one of the first edge and the second edge.

5. The display apparatus of claim 1, further comprising:
a third pad located in the groove and electrically connected to the driving chip;
a fan-out wiring extending from the third pad to the display area; and
a data line electrically connected to the fan-out wiring, wherein
the data line is electrically connected to at least one of the plurality of pixels.

6. The display apparatus of claim 1, wherein
the non-display area comprises:
a groove area overlapping the groove; and
a peripheral area adjacent to the groove area, and
a thickness of the first substrate in the groove area is less than a thickness of the first substrate in the peripheral area.

7. The display apparatus of claim 1, wherein a depth of the groove is greater than a thickness of the driving chip.

8. The display apparatus of claim 1, further comprising:
a second substrate facing the first substrate;
a display element layer between the first substrate and the second substrate; and
an anti-reflection layer located on the second substrate.

9. The display apparatus of claim 1, wherein the first substrate comprises glass.

10. The display apparatus of claim 1, wherein a top surface of the driving chip is below the top surface of the first substrate.

11. A display apparatus comprising:
a first substrate having an integral single-piece form, the first substrate comprising:
a display area;
a non-display area at least partially surrounding the display area; and
a groove that overlaps the non-display area and is recessed in a thickness direction partially through the first substrate;
a plurality of pixels located on the first substrate and overlapping the display area;
a driving chip located in the groove such that at least a bottom surface of the driving chip is below a top surface of the first substrate; and
a printed circuit board located in the non-display area;
a first pad adjacent to the groove and electrically connected to the printed circuit board; and
a second pad located in the groove and electrically connected to the driving chip, wherein
the first pad and the second pad are disposed parallel to each other in a direction in which an edge of the first substrate extends in a plan view.

12. The display apparatus of claim 11, wherein the printed circuit board overlaps the driving chip in the plan view.

13. The display apparatus of claim 11, further comprising:
a connection wiring extending from the first pad to the second pad, wherein
the driving chip and the printed circuit board are electrically connected to each other.

14. The display apparatus of claim 13, wherein
the groove comprises:
a first edge adjacent to the display area;
a second edge between the first pad and the second pad; and
a third edge adjacent to the edge of the first substrate, and
the connection wiring extends to cross at least one of the first edge and the second edge.

15. The display apparatus of claim 11, further comprising:
a third pad located in the groove and electrically connected to the driving chip; and
a fan-out wiring extending from the third pad to the display area, wherein the first pad, the second pad, and the third pad are disposed parallel to one another in a direction in which the edge of the first substrate extends in the plan view.

16. The display apparatus of claim 15, further comprising:
a data line electrically connected to the fan-out wiring, wherein
the data line is electrically connected to at least one of the plurality of pixels.

17. The display apparatus of claim 11, wherein
the non-display area comprises:
 a groove area overlapping the groove; and
 a peripheral area adjacent to the groove area, and
a thickness of the first substrate in the groove area is less than a thickness of the first substrate in the peripheral area.

18. The display apparatus of claim 11, wherein a depth of the groove is greater than a thickness of the driving chip.

19. The display apparatus of claim 11, further comprising:
a second substrate facing the first substrate;
a display element layer between the first substrate and the second substrate; and
an anti-reflection layer located on the second substrate.

20. The display apparatus of claim 11, wherein the first substrate comprises glass.

\* \* \* \* \*